United States Patent
Efimov et al.

(10) Patent No.: US 10,564,263 B2
(45) Date of Patent: Feb. 18, 2020

(54) CHIP-SCALE LIDAR WITH A SINGLE MEMS SCANNER IN A COMPACT OPTICAL PACKAGE

(71) Applicant: GM GLOBAL TECHNOLOGY OPERATIONS LLC, Detroit, MI (US)

(72) Inventors: Oleg Efimov, Thousand Oaks, CA (US); Raymond Sarkissian, Studio City, CA (US); Keyvan Sayyah, Santa Monica, CA (US); David Hammon, Simi Valley, CA (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 16/019,691

(22) Filed: Jun. 27, 2018

(65) Prior Publication Data

US 2019/0018120 A1    Jan. 17, 2019

Related U.S. Application Data

(60) Provisional application No. 62/531,414, filed on Jul. 12, 2017.

(51) Int. Cl.
*G01S 7/491* (2006.01)
*G02B 6/27* (2006.01)
(Continued)

(52) U.S. Cl.
CPC .............. *G01S 7/4815* (2013.01); *B81B 7/02* (2013.01); *G01S 7/4816* (2013.01);
(Continued)

(58) Field of Classification Search
CPC ...... G01S 7/4817; G01S 7/4914; G01S 7/491; G01S 7/4972; G01S 7/4818;
(Continued)

(56) References Cited

U.S. PATENT DOCUMENTS

| 5,139,879 A | 8/1992 | Aharoni | |
| 5,283,846 A * | 2/1994 | Toyonaka | ............ G02B 6/4208 359/484.03 |

(Continued)

OTHER PUBLICATIONS

Hobbs, Philip C. D. "Ultrasensitive laser measurements without tears", Applied Optics, vol. 36, No. 4, Feb. 1, 1997, pp. 903-920.
(Continued)

*Primary Examiner* — Sang H Nguyen
(74) *Attorney, Agent, or Firm* — Cantor Colburn LLP

(57) ABSTRACT

A LIDAR system, optical coupler for a LIDAR system and method of optical communication. The LIDAR system includes an optical coupler having a chip-side face in optical communication with a photonic chip and a scanner-side face in optical communication with a scanner, the optical coupler comprising a polarization rotator and a birefringent wedge. A first beam of light is transmitted from the first location toward a chip-side face of an optical coupler to direct the first beam of light, via the optical coupler, along an optical path at a scanner-side face of the optical coupler. A second beam of light is received along the optical path at the scanner-side face and directed the second beam of light toward a second location.

20 Claims, 2 Drawing Sheets

(51) Int. Cl.

| | | |
|---|---|---|
| *G02B 6/42* | (2006.01) | |
| *G01S 17/02* | (2006.01) | |
| *G01S 7/481* | (2006.01) | |
| *G01S 7/4911* | (2020.01) | |
| *G01S 17/58* | (2006.01) | |
| *G01S 17/93* | (2020.01) | |
| *H01L 23/544* | (2006.01) | |
| *H01L 31/0232* | (2014.01) | |
| *H01L 31/16* | (2006.01) | |
| *G01S 17/00* | (2020.01) | |
| *G01S 17/32* | (2020.01) | |
| *G01S 7/4914* | (2020.01) | |
| *G01S 7/497* | (2006.01) | |
| *B81B 7/02* | (2006.01) | |
| *G02B 27/30* | (2006.01) | |
| *H01S 5/125* | (2006.01) | |
| *G01S 7/4913* | (2020.01) | |

(52) U.S. Cl.
CPC .......... *G01S 7/4817* (2013.01); *G01S 7/4818* (2013.01); *G01S 7/491* (2013.01); *G01S 7/4911* (2013.01); *G01S 7/4913* (2013.01); *G01S 7/4914* (2013.01); *G01S 7/4972* (2013.01); *G01S 17/003* (2013.01); *G01S 17/023* (2013.01); *G01S 17/32* (2013.01); *G01S 17/325* (2013.01); *G01S 17/58* (2013.01); *G01S 17/936* (2013.01); *G02B 27/30* (2013.01); *H01L 23/544* (2013.01); *H01L 31/02327* (2013.01); *H01L 31/16* (2013.01); *H01S 5/125* (2013.01); *B81B 2207/03* (2013.01); *H01L 2223/54426* (2013.01); *H01L 2223/54486* (2013.01)

(58) Field of Classification Search
CPC .... G01S 7/4913; G01S 7/4815; G01S 7/4911; G01S 17/42; G01S 17/003; G01S 17/32; G01S 17/023; G01S 17/325; G01S 17/58; G01S 17/936; H01L 31/16; H01L 31/02327; H01L 2223/54426; H01L 2223/54486
See application file for complete search history.

(56) References Cited

U.S. PATENT DOCUMENTS

| | | | |
|---|---|---|---|
| 5,499,132 A * | 3/1996 | Tojo | G02B 5/3083 |
| | | | 359/281 |
| 6,122,110 A * | 9/2000 | Park | G02F 1/093 |
| | | | 359/641 |
| 6,229,947 B1 | 5/2001 | Vawter | |
| 6,480,331 B1 * | 11/2002 | Cao | G02B 5/3083 |
| | | | 359/281 |
| 6,962,345 B2 | 11/2005 | Inciong | |
| 7,108,810 B2 | 9/2006 | Nakamura | |
| 7,359,593 B2 | 4/2008 | Little | |
| 7,481,588 B2 | 1/2009 | Monte | |
| 8,116,602 B2 | 2/2012 | Little | |
| 8,121,450 B2 | 2/2012 | Webster | |
| 9,122,037 B2 | 9/2015 | Shastri et al. | |
| 9,310,471 B2 | 4/2016 | Sayyah | |
| 9,335,480 B1 * | 5/2016 | Celo | G02B 6/305 |
| 9,575,162 B2 | 2/2017 | Owechko | |
| 2001/0030807 A1 * | 10/2001 | Ikari | G02B 5/3083 |
| | | | 359/484.03 |
| 2002/0012167 A1 * | 1/2002 | Wills | G02B 6/272 |
| | | | 359/484.03 |
| 2004/0070827 A1 * | 4/2004 | Li | G02B 6/2746 |
| | | | 359/484.03 |
| 2005/0018967 A1 * | 1/2005 | Huang | G02B 6/2746 |
| | | | 385/39 |
| 2005/0213979 A1 * | 9/2005 | Nakashima | H04B 10/07 |
| | | | 398/79 |
| 2006/0002443 A1 | 1/2006 | Farber | |
| 2010/0200898 A1 | 8/2010 | Lin | |
| 2012/0152918 A1 * | 6/2012 | Li | B23K 26/066 |
| | | | 219/121.75 |
| 2013/0209033 A1 | 8/2013 | Luff | |
| 2015/0042992 A1 * | 2/2015 | Cui | G02B 21/002 |
| | | | 356/369 |
| 2017/0153319 A1 * | 6/2017 | Villeneuve | G01S 17/00 |
| 2017/0184450 A1 * | 6/2017 | Doylend | G01J 1/4228 |
| 2017/0336565 A1 | 11/2017 | Ryckman | |
| 2017/0370676 A1 * | 12/2017 | Volfson | G01S 17/08 |
| 2018/0024299 A1 | 1/2018 | Leijtens | |

OTHER PUBLICATIONS

Schroedter et al., "Microcontroller based closed-loop control of a 2D quasi-static/resonant microscanner with on-chip piezo-resistive sensor feedback", Proc. of SPIE, vol. 10116, 2017, pp. 1-12.

Winter et al., "Micro-beamer based on MEMS micro-mirrors and laser light source", Procedia Chemistry, vol. 1, Issue 1, 2009, pp. 1311-1314.

* cited by examiner

CHIP-SCALE LIDAR WITH A SINGLE MEMS SCANNER IN A COMPACT OPTICAL PACKAGE

CROSS-REFERENCE TO RELATED APPLICATIONS

This application claims the benefit of priority of U.S. Provisional Application No. 62/531,414 filed Jul. 12, 2017, the disclosure of which is incorporated herein by reference in its entirety.

INTRODUCTION

The subject disclosure relates to chip-scale LIDAR (light detection and ranging) systems and, in particular, to an optical coupler for directing light between a photonic chip and a scanner of the LIDAR chip system.

A chip-based LIDAR system includes a photonic chip that transmits and receives light and a MEMS (microelectromechanical systems) scanner that directs the transmitted light to a selected point in space and directs reflected light from the selected point in space into the photonic chip. A transmitted light beam generally exits the photonic chip from a first location of the photonic chip and reflected light enters the photonic chip at a second location of the photonic chip. The first location and second location are separated by a selected distance, thus requiring that transmitted and reflected light traverse separate optical paths between the MEMS scanner and the photonic chip. Accordingly, it is desirable to provide an optical coupling device that directs light traversing in one direction along a first optical path and directs light traversing in another direction along another optical path.

SUMMARY

In one exemplary embodiment, a LIDAR system is disclosed. The LIDAR system includes an optical coupler having a chip-side face in optical communication with a photonic chip and a scanner-side face in optical communication with a scanner, the optical coupler comprising a polarization rotator and a birefringent wedge, wherein the optical coupler directs a first beam of light received at the chip-side face from a first location of the photonic chip toward the scanner along an optical path and directs a second beam of light received at the scanner-side face along the optical path to a second location of the photonic chip.

In addition to one or more of the features described herein, the polarization rotator is a Faraday rotator. The first beam of light enters the birefringent wedge with a polarization direction different from the polarization direction at which the second beam of light entered the birefringent wedge. The first beam of light experiences a first angle of refraction at the birefringent wedge and the second beam of light experiences a second angle of refraction at the birefringent wedge, wherein the difference between the first angle of refraction and the second angle of refraction is due to a difference in the directions of polarization. The optical coupler further includes collimating optics. The optical coupler further includes a polarizer at a scanner-side face that polarizes the first beam of light and the second beam of light. A half-wave plate at the second location changes a polarization of the second beam of light. The photonic chip transmits the first beam of light from the first location and receives the second beam of light at the second location. The scanner includes a MEMS scanner in the optical path for directing the first beam of light to a selected point in space and receiving the second beam of light from the selected point in space.

In one exemplary embodiment, an optical coupler for a LIDAR system is disclosed. The optical coupler includes a chip-side face in optical communication with a photonic chip, a scanner-side face in optical communication with a scanner, a polarization rotator, and a birefringent wedge. The optical coupler directs a first beam of light received at the chip-side face from a first location of the photonic chip space along an optical path at the scanner and directs a second beam of light received at the scanner-side face along the optical path to a second location of the photonic chip.

In addition to one or more of the features described herein, the polarization rotator further includes a Faraday rotator configured to rotate a polarization of at least the second beam of light, wherein the first beam of light enters the birefringent wedge with a polarization direction different from the polarization direction at which the second beam of light entered the birefringent wedge. The optical coupler further includes collimating optics. The optical path includes a MEMS scanner that directs the first beam of light to a selected point in space and receives the second beam of light from the selected point in space. The optical coupler further includes a polarizer that polarizes the first beam of light and the second beam of light. A half-wave plate at the second location changes a polarization of the incoming second beam of light. The first location of the photonic chip includes a laser and the second location includes an edge coupler of the photonic chip.

In yet another exemplary embodiment, a method of optical communication is disclosed. The method includes transmitting a first beam of light from a first location toward a chip-side face of an optical coupler having a polarization rotator and a birefringent wedge, directing the first beam of light, via the optical coupler, along an optical path at a scanner-side face of the optical coupler, receiving a second beam of light along the optical path at the scanner-side face, and directing the second beam of light toward a second location of the photonic chip at the chip-side face.

In addition to one or more of the features described herein, the polarization rotator is a Faraday rotator. The method further includes rotating a polarization of at least the second beam of light at the Faraday rotator, and altering the optical paths of the first beam of light and the second beam of light at the birefringent wedge based on their respective polarizations. The method further includes changing a polarization of the second beam of light at the second location using a half-wave plate. The method further includes steering the first beam of light to a selected point in space using a MEMS scanner in the optical path and receives the second beam of light from the selected point in space.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
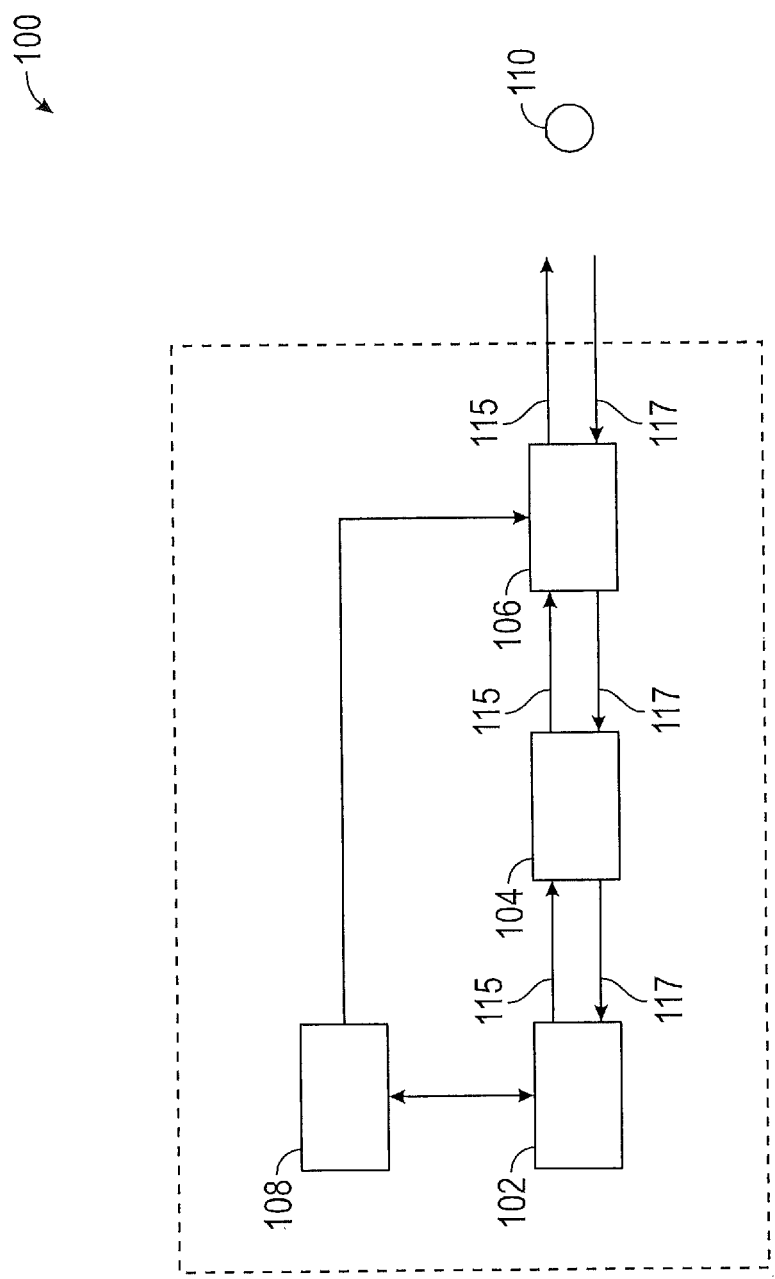
FIG. 1 shows a schematic diagram of a LIDAR system.

The following description is merely exemplary in nature and is not intended to limit the present disclosure, its application or uses. It should be understood that throughout the drawings, corresponding reference numerals indicate like or corresponding parts and features.

In accordance with an exemplary embodiment, FIG. 1 shows a schematic diagram of a LIDAR system 100. The LIDAR system 100 includes a photonic chip 102, an optical coupler 104, and a microelectromechanical system (MEMS) scanner 106. A processor 108 controls the operation of the photonic chip 102 in order to perform operations of the LIDAR system 100. The photonic chip 102 includes a light source, such as a laser, an optical waveguiding network and a set of photodiodes. The laser generates a transmitted light beam 115 that is transmitted out of the photonic chip 102. A reflected light beam 117, which is due to interaction of the transmitted light beam 115 with an object 110 is optically mixed with a fraction (<10%) of the transmitted light beam 115, in a set of photodiodes. The processor 108 controls the operation of the light source by controlling a waveform by which the light source operates. The processor 108 further receives data from the photodiodes and determines various parameters of an object 110 from the data.

In operation, the processor 108 controls the light source of the photonic chip 102 to generate a modulated transmitted beam of light 115. The transmitted beam of light 115 passes through the optical coupler 104 which collimates the transmitted light beam 115 and directs the transmitted light beam 115 toward the MEMS scanner 106. The MEMS scanner 106 steers the transmitted light beam 115 over a range of angles into a surrounding region of the LIDAR system 100.

The MEMS scanner 106 includes a vibrating member such as a vibrating mirror. The processor 108 controls an oscillation of the vibrating member in order to steer the transmitted light beam 115 over a selected range of angles. In various embodiments, the MEMS scanner 106 is a two-dimensional (2D) MEMS scanner, and the processor 108 controls oscillation of the vibration member in two angular direction, such as azimuth and elevation.

Reflected light beam 117 is formed when object 110 interacts with the transmitted light beam 115. A portion of the reflected light beam 117 is received at the MEMS scanner 106. The MEMS scanner 106 directs the reflected light beam 117 into the optical coupler 104 which passes the reflected light beam 117 into the photonic chip 102. Details of the optical coupler 104 are discussed further herein with respect to FIG. 2.

In various embodiments, the LIDAR system 100 can be associated with a vehicle and the object 110 can be any object external to the vehicle, such as another vehicle, a pedestrian, a telephone pole, etc. The LIDAR system 100 determines parameters such as range, Doppler, and the azimuth and elevation of the object 110 and the vehicle uses these parameters to navigate with respect to the object 110 for the purposes of avoiding contact with the object 110.

Figure 2:
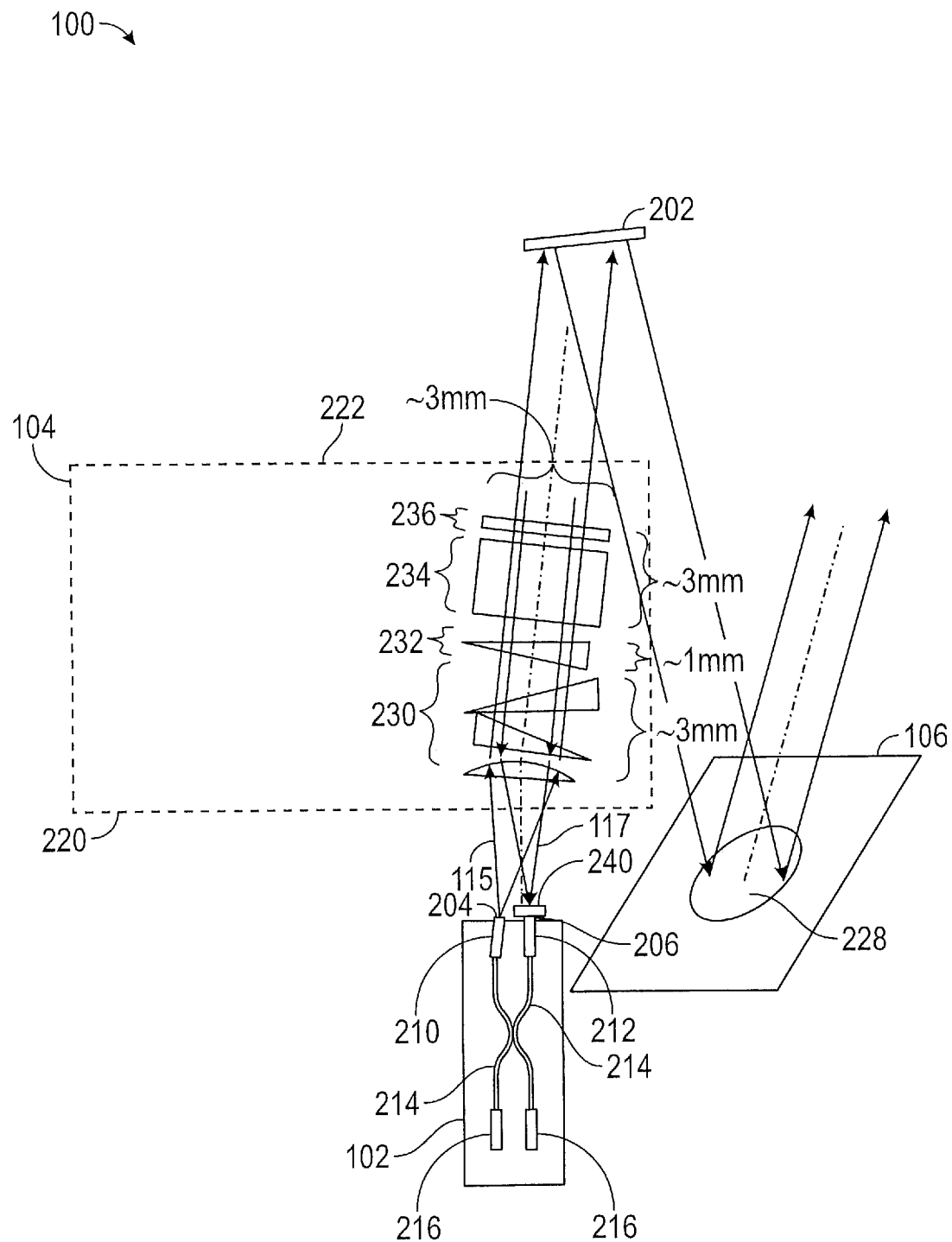
FIG. 2 shows a detailed view of the LIDAR system of FIG. 1.

FIG. 2 shows a detailed view of the LIDAR system 100 of FIG. 1. The LIDAR system 100 includes the photonic chip 102, the optical coupler 104 and the MEMS scanner 106. A mirror 202 in the optical path between the optical coupler 104 and the MEMS scanner 106 directs the light back and forth between the optical coupler 104 and the MEMS scanner 106.

In one embodiment, the photonic chip 102 includes a laser 210 or other suitable light source for generating a transmitted light beam 115 that propagates from the photonic chip 102. The photonic chip 102 also includes an edge coupler 212 placed at a selected distance from the laser 210 for receiving incoming light at the photonic chip 102. Waveguides 214 are connected to the laser 210 and edge coupler 212 in order to provide light from the laser 210 (emitted at a back end of the laser) and from the edge coupler 210 to photodetectors 216. Photodetectors 216 determine the range and velocity of an object 110, FIG. 1 in the environment as obtained from differences between the optical frequency of the outgoing beam of light 115 generated by the laser 210 and the incoming beam of light 117 received at the edge coupler 212.

In alternate embodiments, the laser 210 may be at another location of the photonic chip 102. However, for any embodiment, the photonic chip 102 includes a first location 204 from which transmitted light 115 exits the photonic chip 102 and a second location 206 at which reflected light 117 enters the photonic chip 102. The first location 204 and the second location 206 have a separation distance between them. In various embodiments, the properties of the optical coupler 104 can be selected in order to provide optical communication with both the first location 204 and the second location 206 of the photonic chip 102.

The optical coupler 104 includes a chip-side face 220 that faces the photonic chip 102 and a scanner-side face 222 that faces the mirror 202. Transmitted light 115 from the first location 204 of the photonic chip 102 enters the optical coupler 104 at the chip-side face 220. Also, the reflected light 117 exits the optical coupler 104 at the chip-side face 220 in the direction of the second location 206 of the photonic chip 102. At the scanner-side face 222, transmitted light 115 and reflected light 117 enters and exits, respectively, the optical coupler 104 at a single point, thereby enabling the transmitted light 115 and reflected light 117 to travel along the same optical path, although in opposite directions.

Transmitted light exiting the optical coupler 104 from the scanner-side face 222 is directed towards the mirror 202 which redirects the transmitted light 115 onto a vibrating membrane 228 of the scanner 106. The scanner 106 diverts the optical path of the transmitted light 115 over an angular range through vibration of the membrane 228. The angular range can be two-dimensional, being characterized by an azimuth angle and an elevation angle. Incoming light, traveling along the same optical path as the outgoing light in the environment is thus directed by the scanner 106 and the mirror 202 to impinge on the optical coupler 104.

Returning to the optical coupler 104, the optical coupler 104 includes a collimating optics 230, a birefringent wedge 232, a Faraday rotator 234, and a polarizer 236. The collimating optics 230 can include a collimating lens and an anamorphic prism pair for laser beam rounding. The elements of the optical coupler 104 can be provided in a single optical package that can be placed between the photonic chip 102 and the scanner 106 as a single unit during the manufacture of the LIDAR system 100.

Transmitted light 115 emitted from the laser 210 at the first location 204 of the photonic chip 102 is a divergent beam. The collimator 230 converts the divergent beam into a parallel or substantially parallel beam of light. The reflected light 117 passing through the optical coupler 104 is a parallel or substantially parallel beam of light until the collimator 230 converts the reflected light 117 into a converging beam.

The birefringent wedge 232, Faraday rotator 234 and polarizer 236 are used to separate the optical paths of the transmitted light 115 and reflected light 117, such that on the scanner-side 222 of the optical coupler 104, the transmitted light 115 and the reflected light 117 travels along the same optical path, while on the chip-side 220 of the optical coupler 104, the optical path of the transmitted light 115 passes through the laser 210 while the optical path of the reflected light 117 passes through the edge coupler 112.

A birefringent material is a material in which a refractive index experienced by light passing through the material is dependent on the polarization and propagation direction of the light. The birefringent wedge 232 separates two orthogonally polarized light beams into two separate directions.

The Faraday rotator 234 rotates a polarization of light by exploiting the Faraday effect. The Faraday rotator includes a transparent medium that is exposed to magnetic field lines that are aligned in approximately the same (or opposite) direction as the beam direction. In the presence of the magnetic field, the polarization direction of the light is continuously rotated during the passage through the medium. It is to be understood that other devices or polarization rotators that rotate the polarization vector of light can be used in place of the Faraday rotator 234 in alternate embodiments.

The transmitted light beam 115 encounters sequentially, the collimating optics 230, the birefringent wedge 232, the Faraday rotator 234 and the polarizer 236 as it passes through the optical coupler 104. Being emitted by laser 210, the transmitted beam is generally a linearly polarized beam of light. The collimating optics 230 produces a collimated and linearly polarized beam that passes through the birefringent wedge 232. The linear polarization direction of the transmitted light 115 as it enters the birefringent wedge 232 results in a first angle of refraction of the transmitted light 115 at the birefringent wedge 232. The Faraday rotator 234 rotates the light beams of the transmitted light 115 and the polarizer 236 then allows light having a selected polarization direction of the polarizer 236 to pass through.

Traveling in the opposite direction, the reflected light beam 117 is generally a partially-polarized beam of light that encounters sequentially, the polarizer 236, the Faraday rotator 234, the birefringent wedge 232, and the collimating optics 230 as it passes through the optical coupler 104. The polarizer 236 passes the reflected light 117 having a selected polarization and the Faraday rotator rotates the polarization vector of the reflected light 117. The polarization direction of the reflected light 117 as it enters the birefringent wedge 232 results in a second angle of refraction of the reflected light 117 at the birefringent wedge 232. The birefringent wedge 232 refracts the reflected light 117 in a direction towards the second location 206 of the photonic chip 102 and the collimating optics 230 focuses the reflected light 117 onto the second location 206 of the photonic chip 102.

The Faraday rotator 234 is operated so that the polarization of the transmitted light beam 115 entering the birefringent wedge 232 is different from the polarization of the reflected light beam 117 entering the birefringent wedge 232. Therefore, the transmitted light beam 115 and the reflected light beam 117 experience different angles of refraction at the birefringent wedge 232. The angle of refraction for the transmitted light beam allows the transmitted light received from the first location 204 of the photonic chip 102 to be directed onto a selected optical path. The angle of refraction for the reflected light beam 117 allows the reflected light received along the same optical path as the transmitted light to be directed toward the second location 206 of the photonic chip 102. In various embodiments, a distance between the chip-side face 220 of the optical coupler 104 and the first location 204 and second location 206 of the photonic chip 104 is selected so that the optical paths of transmitted light 115 and of the reflected light 117 are aligned with first location 204 and second location 206, respectively.

A half-wave plate 240 placed over the edge coupler 212 adjusts a polarization of the reflected light beam 117 so that light entering the photonic chip 102 has a same polarization of laser light in the waveguides, leading to an interaction of the laser light and the reflected light that can be detected at the photodetectors 216.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A LIDAR system, comprising:
an optical coupler having a chip-side face in optical communication with a photonic chip and a scanner-side face in optical communication with a scanner, the optical coupler comprising a polarization rotator, a birefringent wedge between the chip-side face and the polarization rotator and a polarizer between the scanner-side face and the birefringent wedge, wherein the optical coupler directs a first beam of light received at the chip-side face from a first location of the photonic chip toward the scanner along an optical path and directs a second beam of light received at the scanner-side face along the optical path to a second location of the photonic chip.

2. The LIDAR system of claim 1, wherein the polarization rotator is a Faraday rotator.

3. The LIDAR system of claim 1, wherein the first beam of light enters the birefringent wedge with a polarization direction different from the polarization direction at which the second beam of light enters the birefringent wedge.

4. The LIDAR system of claim 1, wherein the first beam of light experiences a first angle of refraction at the birefringent wedge and the second beam of light experiences a second angle of refraction at the birefringent wedge, wherein the difference between the first angle of refraction and the second angle of refraction is due to a difference in the directions of polarization.

5. The LIDAR system of claim 1, wherein the optical coupler further comprises collimating optics between the chip-side face and the birefringent wedge.

6. The LIDAR system of claim 1, wherein the polarizer polarizes the first beam of light and the second beam of light.

7. The LIDAR system of claim 1, further comprising a half-wave plate at the second location for changing a polarization of the second beam of light.

8. The LIDAR system of claim 1, wherein the photonic chip transmits the first beam of light from the first location and receives the second beam of light at the second location.

9. The LIDAR system of claim 1, wherein the scanner comprises a MEMS scanner in the optical path for directing the first beam of light to a selected point in space and receiving the second beam of light from the selected point in space.

10. An optical coupler for a LIDAR system, comprising:
a chip-side face in optical communication with a photonic chip;
a scanner-side face in optical communication with a scanner;
a polarization rotator;
a birefringent wedge between the chip-side face and the polarization rotator; and
a polarizer between the scanner-side face and the birefringent wedge;
wherein the optical coupler directs a first beam of light received at the chip-side face from a first location of the photonic chip space along an optical path at the scanner and directs a second beam of light received at the scanner-side face along the optical path to a second location of the photonic chip.

11. The optical coupler of claim 10, wherein the polarization rotator further comprises a Faraday rotator configured to rotate a polarization of at least the second beam of light, wherein the first beam of light enters the birefringent wedge with a polarization direction different from the polarization direction at which the second beam of light entered the birefringent wedge.

12. The optical coupler of claim 10, further includes collimating optics.

13. The optical coupler of claim 10, wherein the optical path includes a MEMS scanner that directs the first beam of light to a selected point in space and receives the second beam of light from the selected point in space.

14. The optical coupler of claim 10, wherein the polarizer polarizes the first beam of light and the second beam of light.

15. The optical coupler of claim 10, wherein a half-wave plate at the second location changes a polarization of the incoming second beam of light.

16. The optical coupler of claim 10, wherein the first location of the photonic chip includes a laser and the second location includes an edge coupler of the photonic chip.

17. A method of optical communication, comprising:
transmitting a first beam of light from a first location toward a chip-side face of an optical coupler having a polarization rotator, a birefringent wedge between the chip-side face of the optical coupler and the polarization rotator and a polarizer between a scanner-side face of the optical coupler and the birefringent wedge;
directing the first beam of light, via the optical coupler, along an optical path at the scanner-side face of the optical coupler;
receiving a second beam of light along the optical path at the scanner-side face; and
directing the second beam of light toward a second location of the photonic chip at the chip-side face.

18. The method of claim 17, wherein the polarization rotator further comprises a Faraday rotator, the method further comprising rotating a polarization of at least the second beam of light at the Faraday rotator, and altering the optical paths of the first beam of light and the second beam of light at the birefringent wedge based on their respective polarizations.

19. The method of claim 18, further comprising changing a polarization of the second beam of light at the second location using a half-wave plate.

20. The method of claim 17, further comprising steering the first beam of light to a selected point in space using a MEMS scanner in the optical path and receives the second beam of light from the selected point in space.

* * * * *